US012703140B2

(12) United States Patent
Taki

(10) Patent No.: US 12,703,140 B2
(45) Date of Patent: Aug. 11, 2026

(54) IMPRINT APPARATUS AND ARTICLE MANUFACTURING METHOD

(71) Applicant: CANON KABUSHIKI KAISHA, Tokyo (JP)

(72) Inventor: Tomokazu Taki, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 80 days.

(21) Appl. No.: 18/772,532

(22) Filed: Jul. 15, 2024

(65) Prior Publication Data

US 2025/0042077 A1 Feb. 6, 2025

(30) Foreign Application Priority Data

Aug. 1, 2023 (JP) ................................ 2023-125654

(51) Int. Cl.

| | |
|---|---|
| ***B29C 41/20*** | (2006.01) |
| ***B29C 41/36*** | (2006.01) |
| ***B29C 41/52*** | (2006.01) |
| ***B29C 59/00*** | (2006.01) |
| ***B29C 59/02*** | (2006.01) |
| ***B41F 1/18*** | (2006.01) |
| ***G01B 11/02*** | (2006.01) |
| ***G03F 7/00*** | (2006.01) |
| ***G03F 9/00*** | (2006.01) |

(52) U.S. Cl.

CPC .......... *B29C 59/002* (2013.01); *B29C 59/026* (2013.01); *G01B 11/026* (2013.01); *G03F 7/0002* (2013.01); *G03F 9/7042* (2013.01)

(58) Field of Classification Search

CPC ......... B29C 41/20; B29C 41/36; B29C 41/52; B29C 59/002; B29C 59/005; B29C 59/02; B29C 2059/023; B41F 1/18; G01B 11/026; G03F 7/0002; G03F 9/7042

USPC ....... 264/40.1, 129, 259, 319; 425/110, 135; 101/450.1; 250/559.38; 356/498

See application file for complete search history.

(56) References Cited

U.S. PATENT DOCUMENTS

2006/0065136 A1* 3/2006 Takahashi ............ B29C 59/022 101/3.1
2012/0244245 A1 9/2012 Zhu et al.
2022/0269186 A1* 8/2022 Hattori ................. G03F 7/0002

FOREIGN PATENT DOCUMENTS

JP 2013062286 A 4/2013
KR 1020210012932 A 2/2021
KR 1020220118942 A 8/2022

* cited by examiner

*Primary Examiner* — Leo B Tentoni

(74) *Attorney, Agent, or Firm* — ROSSI, KIMMS & McDOWELL LLP

(57) ABSTRACT

An imprint apparatus including a measurement unit configured to measure a distance to a surface of a mold held by a mold holding unit, thereby obtaining a measurement value, and a control unit configured to perform measurement processing of measuring the distance by the measurement unit for a plurality of portions of a structure provided on the surface of the mold while driving the measurement unit, wherein the measurement value includes a cyclic error caused by a distance between the measurement unit and the mold, and before performing the measurement processing, the control unit adjusts a position of the mold holding unit in a direction intersecting a reference surface such that the distance falls within a distance range corresponding to a range where the measurement value is insensitive to the cyclic error.

13 Claims, 10 Drawing Sheets

FIG. 1

START
LOAD MOLD
S101
MEASURE DUG PORTIONS
S102
S103
ARE ALL OF DUG PORTIONS MEASURED?
NO
YES
DECIDE POSITIONAL SHIFT AMOUNT OF MOLD
S104
LOAD SUBSTRATE
S105
DECIDE POSITIONAL SHIFT AMOUNT OF SUBSTRATE
S106
ARRANGE IMPRINT MATERIAL
S107
FORM PATTERN
S108
UNLOAD SUBSTRATE
S109
UNLOAD MOLD
S110
END

Y
X
Z
Me
20a
20b
20c
20d
21a
21b
21c
21d
23a
23b
23c
23d
24
25
X
MEASUREMENT VALUE (Z)
Y
MEASUREMENT VALUE (Z)

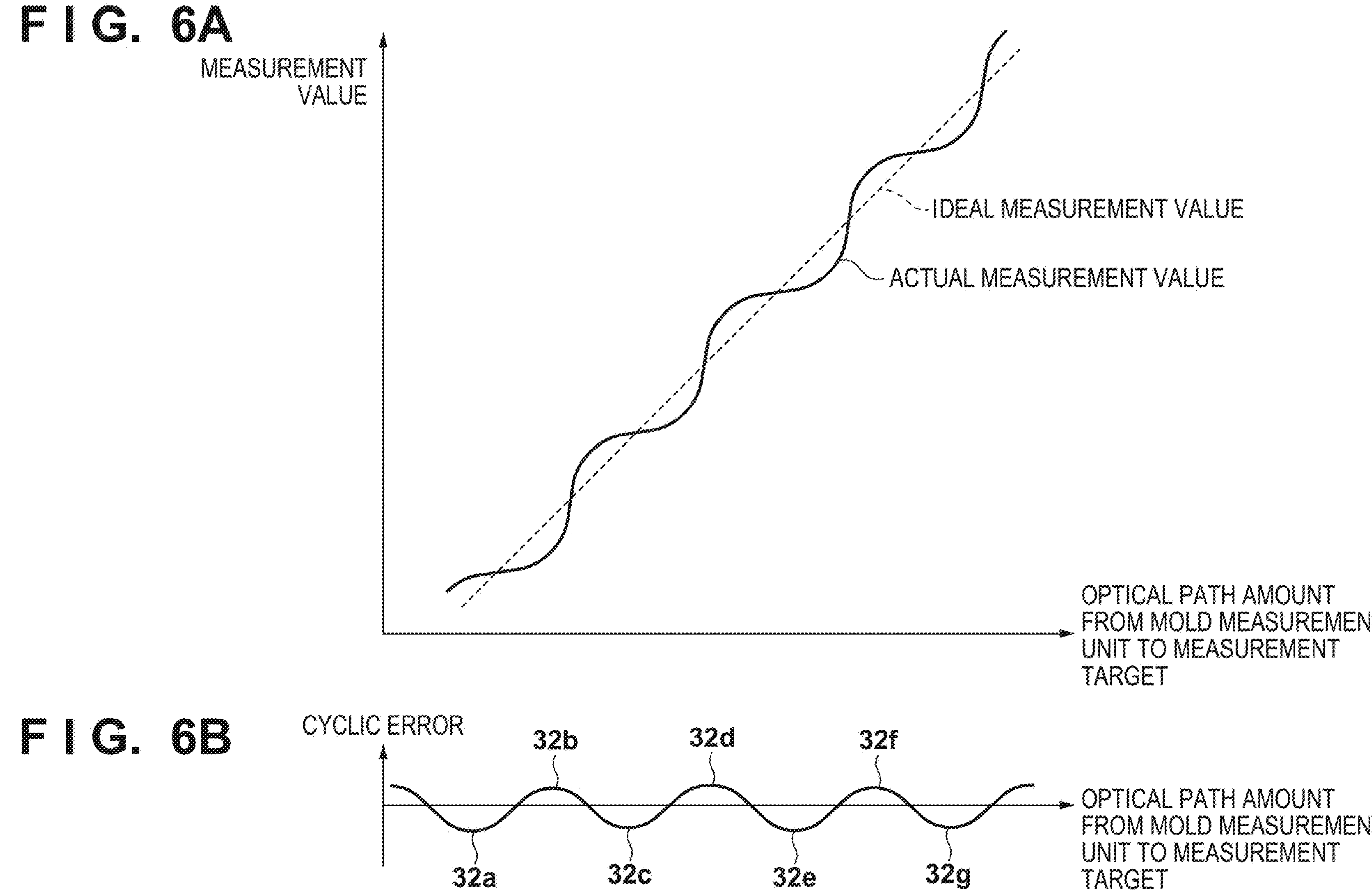
F I G. 6A
MEASUREMENT VALUE
IDEAL MEASUREMENT VALUE
ACTUAL MEASUREMENT VALUE
OPTICAL PATH AMOUNT FROM MOLD MEASUREMENT UNIT TO MEASUREMENT TARGET
F I G. 6B
CYCLIC ERROR
32b
32d
32f
32a
32c
32e
32g
OPTICAL PATH AMOUNT FROM MOLD MEASUREMENT UNIT TO MEASUREMENT TARGET 7
6
4
M
Me
W
10
111
110
130
Δd1

Δd2
Δg

Δd3

14

Δd4

START
DRIVE MOLD HOLDING UNIT TO TARGET POSITION
S301
PRE-DRIVEN STAGE AND DRIVE TO TARGET POSITION
S302
MEASURE SURFACE OF MOLD
S202
S203
IS MEASUREMENT VALUE WITHIN ALLOWABLE RANGE OF PREDETERMINED VALUE?
NO
YES
RESET TARGET POSITION OF MOLD HOLDING UNIT
S206
DRIVE MOLD HOLDING UNIT TO TARGET POSITION
S207
MEASURE GAP AMOUNT
S204
DECIDE POSITIONAL SHIFT AMOUNT
S205
END

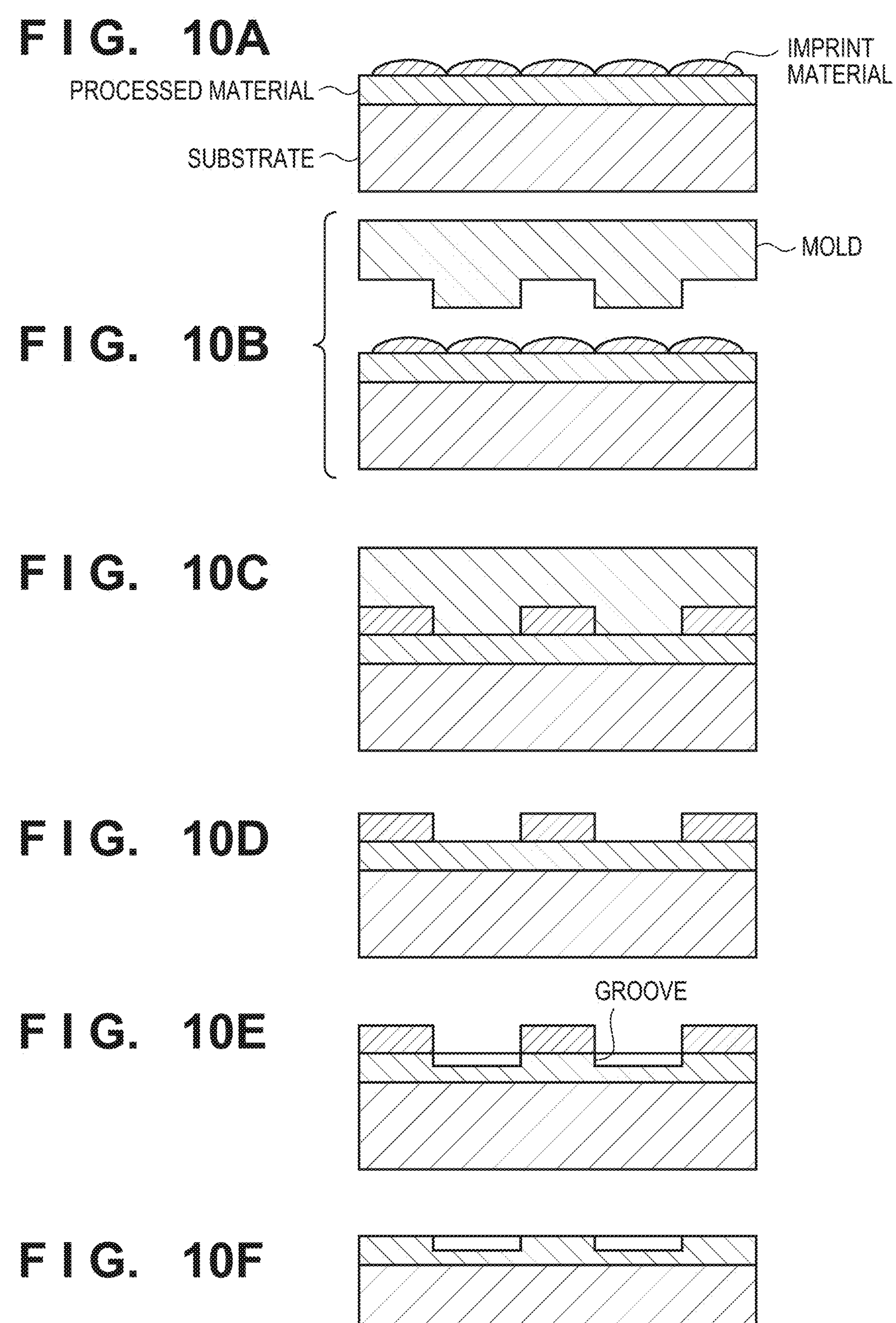
F I G. 10A
IMPRINT MATERIAL
PROCESSED MATERIAL
SUBSTRATE
MOLD
F I G. 10B
F I G. 10C
F I G. 10D
GROOVE
F I G. 10E
F I G. 10F

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

As the requirements of microfabrication for semiconductor devices, Micro Electro Mechanical System (MEMS), and the like grow, not only conventional photolithography techniques but also imprint techniques have received a great deal of attention. An imprint technique is a microfabrication technique for molding an imprint material arranged (supplied) on a substrate using a mold and forming a pattern of the imprint material on the substrate. According to the imprint technique, a fine structure on the order of several nanometers can be formed on the substrate.

In the imprint technique, a photo-curing method is known as one of curing methods of curing an imprint material. In an imprint apparatus employing the photo-curing method, an imprint material is cured by irradiating it with light (such as ultraviolet light) in a state in which the imprint material arranged on a substrate is in contact with a mold, and the mold is released from the cured imprint material, thereby forming a pattern of the imprint material on the substrate.

On the mold generally used in the imprint apparatus, a convex portion called a mesa portion is formed, and a pattern is formed in the mesa portion. Japanese Patent Laid-Open No. 2013-62286 proposes a technique of, in the imprint apparatus, measuring the distance from a measuring device such as a sensor to the mold (surface thereof) while driving the measuring device in a plane, thereby specifying the position of the mesa portion of the mold.

However, with the conventional technique, if the position reproducibility of the measuring device immediately after driving is low, even if the position of the measuring device during driving is stable, the position of the mesa portion (convex portion) of the mold cannot be specified with high accuracy. This is mainly due to the following three factors. The first factor is that a shift (offset) other than a position difference occurs in the measurement value obtained by the measuring device due to the cyclic error phase difference. The second factor is that if the distance within the measurement range (spot) of the measuring device is not uniform due to a step such as a mesa portion in the mold, a measurement value deception (error) occurs due to stray light. The third factor is that the deception included in the measurement value fluctuates in accordance with the phase of the cyclic error.

SUMMARY OF THE INVENTION

The present invention provides an imprint apparatus advantageous in obtaining the position of a mold with high accuracy and forming a pattern on a substrate.

According to one aspect of the present invention, there is provided an imprint apparatus that forms a pattern in an imprint material on a substrate by using a mold, the apparatus including a mold holding unit configured to hold and drive the mold, a substrate holding unit configured to hold and drive the substrate, a measurement unit configured to measure a distance to a surface of the mold held by the mold holding unit, thereby obtaining a measurement value, a driving unit configured to drive the measurement unit in a direction along a reference surface serving as a reference for driving the substrate holding unit, and a control unit configured to perform measurement processing of measuring the distance by the measurement unit for a plurality of portions of a structure provided on the surface of the mold while driving the measurement unit by the driving unit, thereby obtaining a position of the mold in the direction from measurement values of the plurality of portions, wherein the measurement value includes a cyclic error caused by a distance between the measurement unit and the mold, and before performing the measurement processing, the control unit adjusts a position of the mold holding unit in a direction intersecting the reference surface such that the distance measured by the measurement unit falls within a distance range corresponding to a range where the measurement value is insensitive to the cyclic error.

Further aspects of the present invention will become apparent from the following description of exemplary embodiments with reference to the attached drawings.

BRIEF DESCRIPTION OF THE DRAWINGS

FIG. 1 is a schematic view illustrating configurations of an imprint apparatus according to an aspect of the present invention.

FIGS. 6A and 6B are views for describing a cyclic error.

FIGS. 10A to 10F are views for describing an article manufacturing method.

DESCRIPTION OF THE EMBODIMENTS

Figure 2:
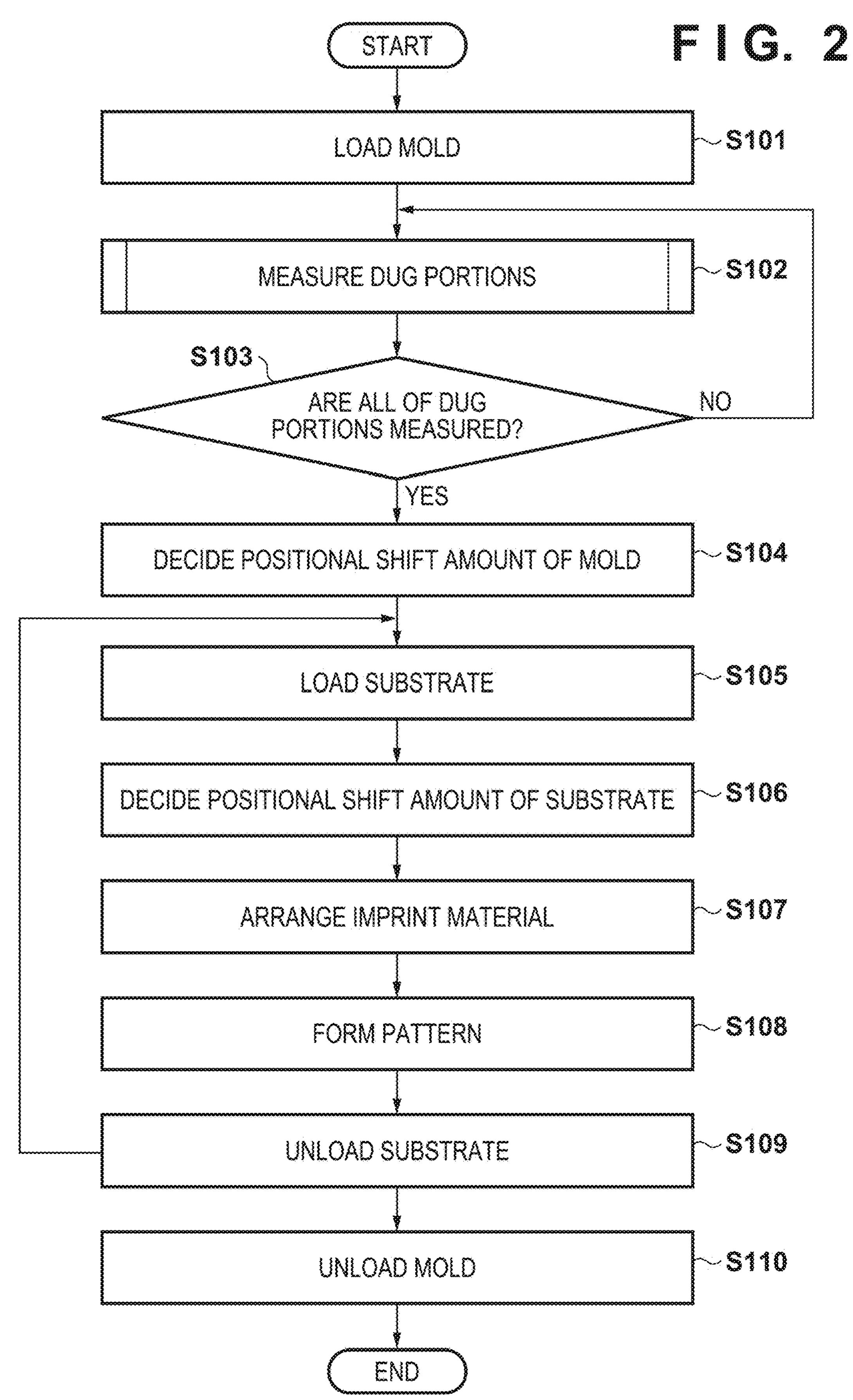
FIG. 2 is a flowchart for describing an operation of the imprint apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 1:
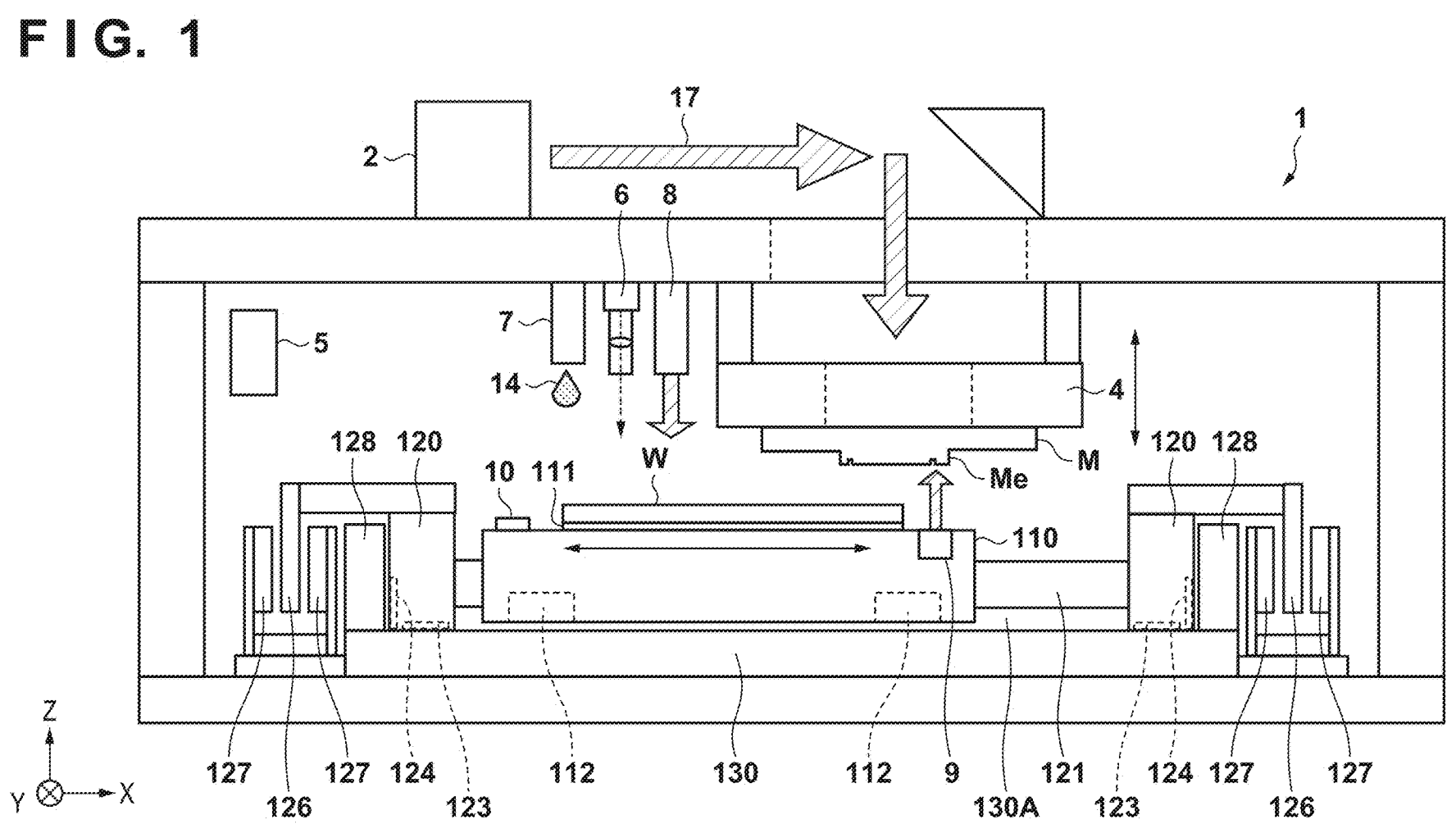

FIG. 1 is a schematic view illustrating configurations of an imprint apparatus 1 according to an aspect of the present invention. The imprint apparatus 1 forms a pattern of an imprint material on a substrate by molding the imprint material on the substrate using a mold. In the embodiment, the imprint apparatus 1 brings an imprint material arranged (supplied) on the substrate into contact with the mold, and applies curing energy to the imprint material, thereby forming a pattern of a cured product to which the pattern of the mold is transferred.

The imprint apparatus 1 is embodied as, for example, a lithography apparatus employed in a lithography step that is a manufacturing step for a device such as a semiconductor element, a liquid crystal display element, or a magnetic storage medium as an article to form a pattern on a substrate. The imprint apparatus 1 is also embodied as a mold forming apparatus that forms a pattern in the convex portion (mesa portion) of a blank mold to form (manufacture), from a mold (master mold) serving as a master, a mold (replica mold) serving as a replica having the same pattern. In this embodiment, a description will be given below assuming that the imprint apparatus 1 is a mold forming apparatus. The replica mold formed by the mold forming apparatus is used as a mold in another imprint apparatus, and used when performing an imprint process on a substrate.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

In the specification and the accompanying drawings, directions will be indicated on an XYZ coordinate system in which directions parallel to a plane on which the substrate is placed are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively.

The imprint apparatus 1 employs, as an imprint material curing method, a photo-curing method of curing an imprint material by irradiating it with light such as ultraviolet light. However, the present invention is not limited to this.

As illustrated in FIG. 1, the imprint apparatus 1 includes an irradiation unit 2, a mold holding unit 4 that holds a mold M, a control unit 5, an alignment measurement system 6, a supply unit 7 that supplies an imprint material 14, a substrate measurement unit 8, and a mold measurement unit 9. The imprint apparatus 1 also includes a stage 110 (substrate holding unit) that holds a substrate W, movable portions 120, and a base 130. The imprint apparatus 1 further includes a mold conveyance apparatus (not shown) that conveys the mold M, and a substrate conveyance apparatus (not shown) that conveys the substrate W.

In an imprint process, the irradiation unit 2 emits light 17 (ultraviolet light) that cures the imprint material 14 on a substrate via the mold M. The irradiation unit 2 includes, for example, a light source, and an optical element that adjust the light 17 emitted from the light source to suitable light to be applied to the imprint material 14.

The mold M includes, on a facing surface that faces the substrate W while being held by the mold holding unit 4, a convex mesa portion Me (convex portion) protruding from the periphery portion. In the surface of the mesa portion Me, a pattern (predetermined concave/convex pattern) to be transferred to the substrate W is formed.

The mold holding unit 4 includes a holding mechanism that holds the mold M, and a driving mechanism that drives the mold M held by the holding mechanism in the Z direction. The mold holding unit 4 may also include a driving mechanism that tilts the mold M in accordance with the tilt of the mold M and/or the substrate W, a driving mechanism that drives the mold M in the X direction and the Y direction, and the like.

The alignment measurement system 6 is a scope used to detect (observe) an alignment mark of the substrate W held by the stage 110 (chuck 111) and specify the position of the substrate W (for example, the position of each shot region on the substrate).

The supply unit 7 includes a dispenser that discharges the imprint material 14, and supplies and arranges the imprint material 14 on a substrate.

The substrate measurement unit 8 has a function of measuring the substrate W. The substrate measurement unit 8 includes a measuring device (distance sensor) that measures the Z-direction distance from the substrate measurement unit 8 to the surface of the substrate W. Based on the measurement result obtained by the substrate measurement unit 8, the height (Z-direction position) of the surface of the substrate W can be obtained. It is also possible to measure the shape of the surface of the substrate W by measuring respective positions of the surface of the substrate W by the substrate measurement unit 8 while driving the stage 110 holding the substrate W along a reference surface 130A.

In this embodiment, the mold measurement unit 9 is provided in the stage 110 (upper surface thereof). The mold measurement unit 9 employs a spectral interference system that can measure the displacement of a measurement target in a non-contact manner, and measures the distance (to be referred to as the "gap amount" hereinafter) from the mold measurement unit 9 to the surface of the mold M. The mold measurement unit 9 includes, for example, a measurement light source (laser light source), an image sensor (distance sensor), and a calculation unit (analysis mechanism). Light emitted from the measurement light source is reflected by the surface of the mold M and becomes return light, which is detected by the image sensor. The calculation unit calculates the gap amount based on the result detected by the image sensor. Examples of the measurement method which the mold measurement unit 9 can employ include, for example, a method of measuring the gap amount from the position of the return light when light enters obliquely to the measurement direction, and a method of measuring the gap amount from the interference fringes between the return light and reference light. Here, the beam spot of the reference light has various shapes such as a circle and an ellipse, and various diameters of 10 μm (inclusive) to 1,000 μm (inclusive). The average of the measurement values in the diameter range of the beam spot is used as the gap amount at the measurement portion on the surface of the mold M.

The stage 110 holds the substrate W via the chuck 111. In this embodiment, the substrate W is a blank mold, that is, a replica mold before a pattern is formed. A stage reference plate 10 is attached (fixed) to the stage 110. The stage reference plate 10 is provided with marks which can be measured by the alignment measurement system 6.

The stage 110 is supported by the movable portions 120 and the base 130. In the base 130, the surface for supporting the stage 110 and the movable portions 120 is referred to as the reference surface 130A (guide surface). The reference surface 130A of the base 130 is a surface parallel to the X-Y plane.

As has been described above, in this embodiment, the mold measurement unit 9 is provided on the upper surface of the stage 110. Accordingly, when the stage 110 is driven along the reference surface 130A (X-Y plane), the mold measurement unit 9 can measure respective positions of the surface of the mold M. Note that the mold measurement unit 9 is not necessarily provided in the stage 110, and may be provided in a mechanism different from the stage 110. Also in this case, by providing a driving unit that drives the mechanism along the X-Y plane, the mold measurement unit 9 can measure respective positions of the surface of the mold M.

The stage 110 is configured to be capable of driving on the reference surface 130A while holding the substrate W by the chuck 111. The stage 110 includes a stage bottom driving mechanism 112 provided on the surface facing the reference surface 130A. The stage bottom driving mechanism 112 includes an air guide (not shown), and forms a space between the stage 110 and the reference surface 130A by blowing out a gas to the reference surface 130A of the base 130, thereby supporting the stage 110 in the Z direction. In the imprint apparatus 1, it is necessary to eliminate friction and wear between the stage 110 and the base 130 (reference surface 130A) to highly accurately drive the stage 110 at high speed with a large stroke in the X direction and the Y direction. Therefore, in this embodiment, the stage 110 is floated from the base 130 by several μm to several tens of μm by the stage bottom driving mechanism 112 (air guide). Further, to stabilize the Z-direction position of the stage 110, the stage bottom driving mechanism 112 may include a chucking mechanism (not shown) that uses a cylinder mechanism utilizing a gas, magnet, or fluid pressure, or the like.

The movable portions 120 drive the stage 110 in the X direction and the Y direction. In this embodiment, the movable portions 120 function as a driving unit that drives the mold measurement unit 9 via the stage 110. Each movable portion 120 includes an X guide portion 121, a bottom air guide 123, a lateral air guide 124, a Y linear motor mover 126, Y linear motor stators 127, and a Y guide portion 128. The bottom air guide 123 blows out a gas to the reference surface 130A of the base 130 to form a space between the movable portion 120 and the reference surface 130A, thereby supporting the movable portion 120. The lateral air guide 124 blows out a gas to the Y guide portion 128 to form a space between the movable portion 120 and the Y guide portion 128.

The movable portion 120 is driven in the Y direction along the Y guide portion 128 by the Y linear motor mover 126 and the Y linear motor stators 127. Along with such driving of the movable portion 120, the stage 110 is also driven in the Y direction.

The movable portion 120 includes an X linear motor mover (not shown) and an X linear motor stator (not shown). The stage 110 is driven in the X direction along the X guide portion 121 by the X linear motor mover and the X linear stator. Note that the imprint apparatus 1 may include a measuring device (position sensor) that measures the position of the stage 110 in the X direction and the Y direction.

The control unit 5 is formed from an information processing apparatus (computer) including a CPU, a memory, and the like. The control unit 5 operates the imprint apparatus 1 by comprehensively controlling the respective units of the imprint apparatus 1 in accordance with a program stored in a storage unit. The control unit 5 may be formed integrally with the imprint apparatus 1 (in a common housing), or may be formed separately from the imprint apparatus 1 (in another housing).

Figure 3:
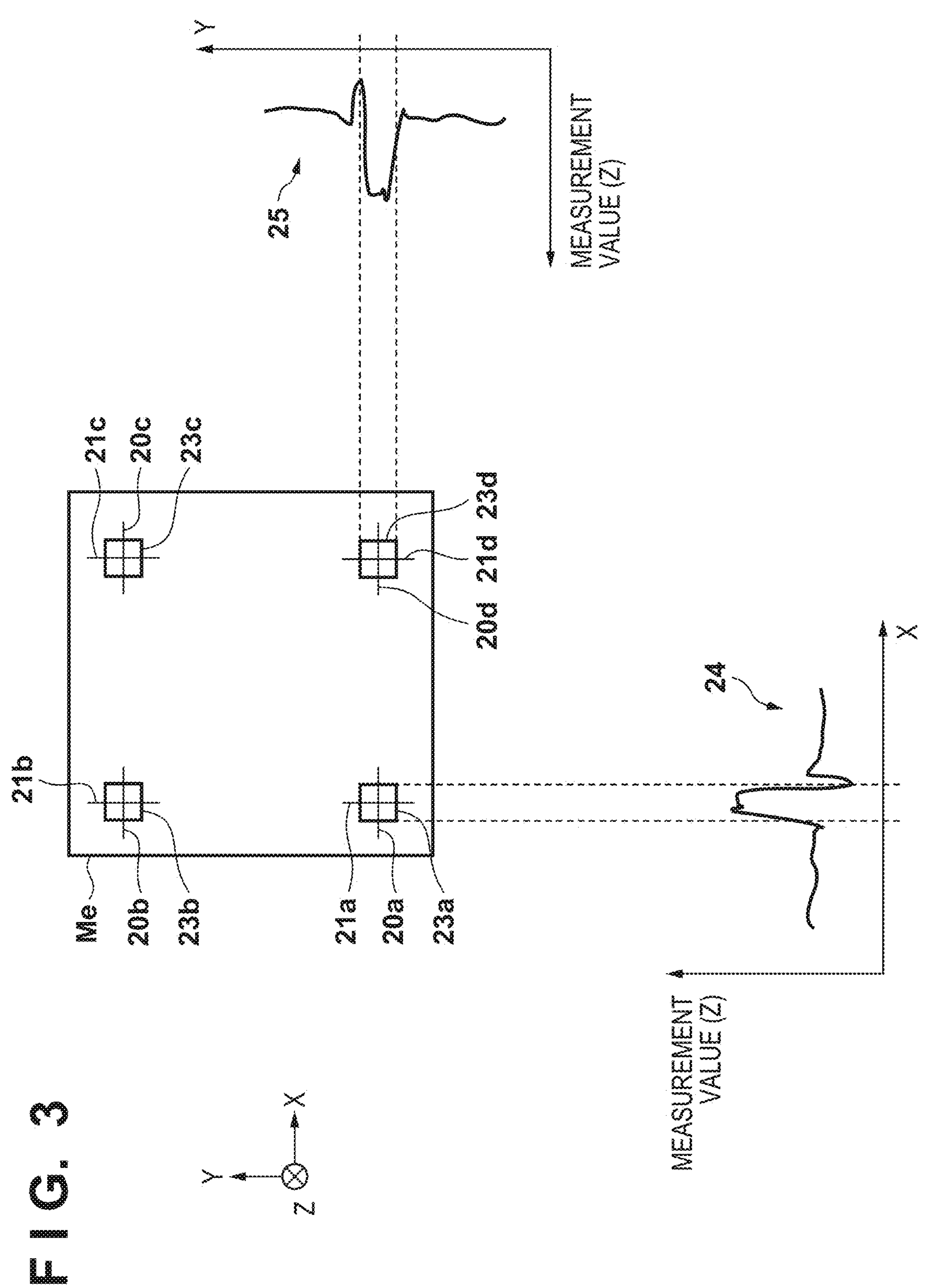
FIG. 3 is a view illustrating configurations of the mesa portion of a mold.

With reference to FIG. 2, the operation of the imprint apparatus 1, more specifically, an imprint process of transferring the pattern of the mold M to the substrate W will be described. The imprint process is performed by the control unit 5 comprehensively controlling the respective units of the imprint apparatus 1. In the imprint process, the mold measurement unit 9 measures dug portions 23*a*, 23*b*, 23*c*, and 23*d* provided in the mesa portion Me of the mold M as illustrated in FIG. 3. The dug portions 23*a* to 23*d* are structures provided on the surface of the mold M, and formed as recessed concave portions formed by digging the surface of the mold M, more specifically, the surface of the mesa portion Me. In this embodiment, the mold measurement unit 9 measures the dug portions 23*a* to 23*d* from the Z direction to obtain the position (positional shift) of the mold M (mesa portion Me thereof) in the X direction and the Y direction by using the concave shapes of the dug portions 23*a* to 23*d*. However, it is also possible to obtain the position of the mold M in the X direction and the Y direction by using not the dug portions 23*a* to 23*d* but another grooves, patterns, shapes, or the like dug inside or outside the mesa portion of the mold M. The depths (dug amounts) of the dug portions 23*a* to 23*d* are preferably 20 nm or more to 200 nm or less, but not limited to this. For example, the depth may be about 1 μm. FIG. 3 is a view illustrating configurations of the mesa portion Me of the mold M.

In step S101, the mold M is loaded to the imprint apparatus 1. More specifically, the mold conveyance apparatus conveys the mold M into the imprint apparatus 1, and the mold M is held (fixed) by the mold holding unit 4.

In step S102, measurement values are obtained by measuring the dug portions 23*a* to 23*d* of the mesa portion Me of the mold M (measurement processing). First, the stage 110 is driven such that the mold measurement unit 9 can measure the dug portions 23*a* to 23*d* of the mesa portion Me of the mold M. Then, the mold measurement unit 9 measures a plurality of portions of each of the dug portions 23*a* to 23*d* provided in the mesa portion Me of the mold M while the mold measurement unit 9 is driven by the stage 110 (movable portions 120). More specifically, as illustrated in FIG. 3, by measuring X-direction measurement target lines (virtual lines) 20*a* to 20*d* and Y-direction measurement target lines (virtual lines) 21*a* to 21*d* of the dug portions 23*a* to 23*d*, respectively, the positional shift amount of the mold M in the X direction and the Y direction is decided. The measurement target line 20*a* and the measurement target line 21*a* are orthogonal to each other, the measurement target line 20*b* and the measurement target line 21*b* are orthogonal to each other, the measurement target line 20*c* and the measurement target line 21*c* are orthogonal to each other, and the measurement target line 20*d* and the measurement target line 21*d* are orthogonal to each other.

In step S103, it is determined whether all of the dug portions 23*a* to 23*d* of the mesa portion Me of the mold M are measured. If not all of the dug portions 23*a* to 23*d* are measured, the process returns to step S102. On the other hand, if all of the dug portions 23*a* to 23*d* are measured, the process transitions to step S104. Note that, in this embodiment, each of the measurement target lines 20*a* to 20*d* and measurement target lines 21*a* to 21*d* is set as a measurement target, but the present invention is not limited to this. For example, depending on whether to give priority to the measurement accuracy due to the averaging effect or to give priority to the processing speed, it is possible to freely set (designate) one or more measurement targets from the measurement target lines 20*a* to 20*d* for the X direction and from the measurement target lines 21*a* to 21*d* for the Y direction.

In step S104, based on the measurement values (the shift amounts for the respective measurement target lines) and the measurement position information obtained in step S102, the positional shift amount of the mold M (mesa portion Me thereof) in the X direction and the Y direction (plane direction) is decided (specified). In this embodiment, as the positional shift amount of the mold M, the X, Y, and θ positional shifts and magnification components of the mold M are decided by a least square method or the like.

In step S105, the substrate W is loaded to the imprint apparatus 1. More specifically, the substrate conveyance apparatus conveys the substrate W into the imprint apparatus 1, and the substrate W is held (fixed) by the stage 110 (chuck 111).

In step S106, the positional shift amount of the substrate W in the X direction and the Y direction (plane direction) is decided (specified). First, the alignment measurement system 6 measures a plurality of alignment marks provided in the substrate W. Then, based on the shift amounts of the respective alignment marks and the measurement position information, the positional shift amount (the X, Y, and θ positional shifts and magnification components of the substrate W) of the substrate W in the X direction and the Y direction (plane direction) is decided (specified).

In step S107, the imprint material 14 is arranged (supplied) on the substrate. More specifically, based on the positional shift amount of the substrate W decided in step S105, the supply unit 7 arranges the imprint material 14 on the substrate (on the shot region of the substrate W).

In step S108, a pattern is formed on the substrate. First, the mold M is brought into contact with the imprint material 14 arranged on the substrate, and the mold M and the substrate W are aligned based on the positional shift amount of the mold M decided in step S103. Then, in the state in which the mold M is in contact with the imprint material 14 on the substrate, the irradiation unit 2 emits the light 17 to cure the imprint material 14. Then, the mold M is released from the cured imprint material 14 on the substrate. Thus, the pattern of the imprint material 14 (the cured product of the imprint material 14 with the pattern of the mold M transferred thereto) is formed on the substrate.

In step S109, the substrate W is unloaded from the imprint apparatus 1. More specifically, the substrate conveyance apparatus conveys the substrate W held by the stage 110 to outside the imprint apparatus 1.

In step S110, the mold M is unloaded from the imprint apparatus 1. More specifically, the mold conveyance apparatus unloads the mold M held by the mold holding unit 4 to outside the imprint apparatus 1.

Figure 4:
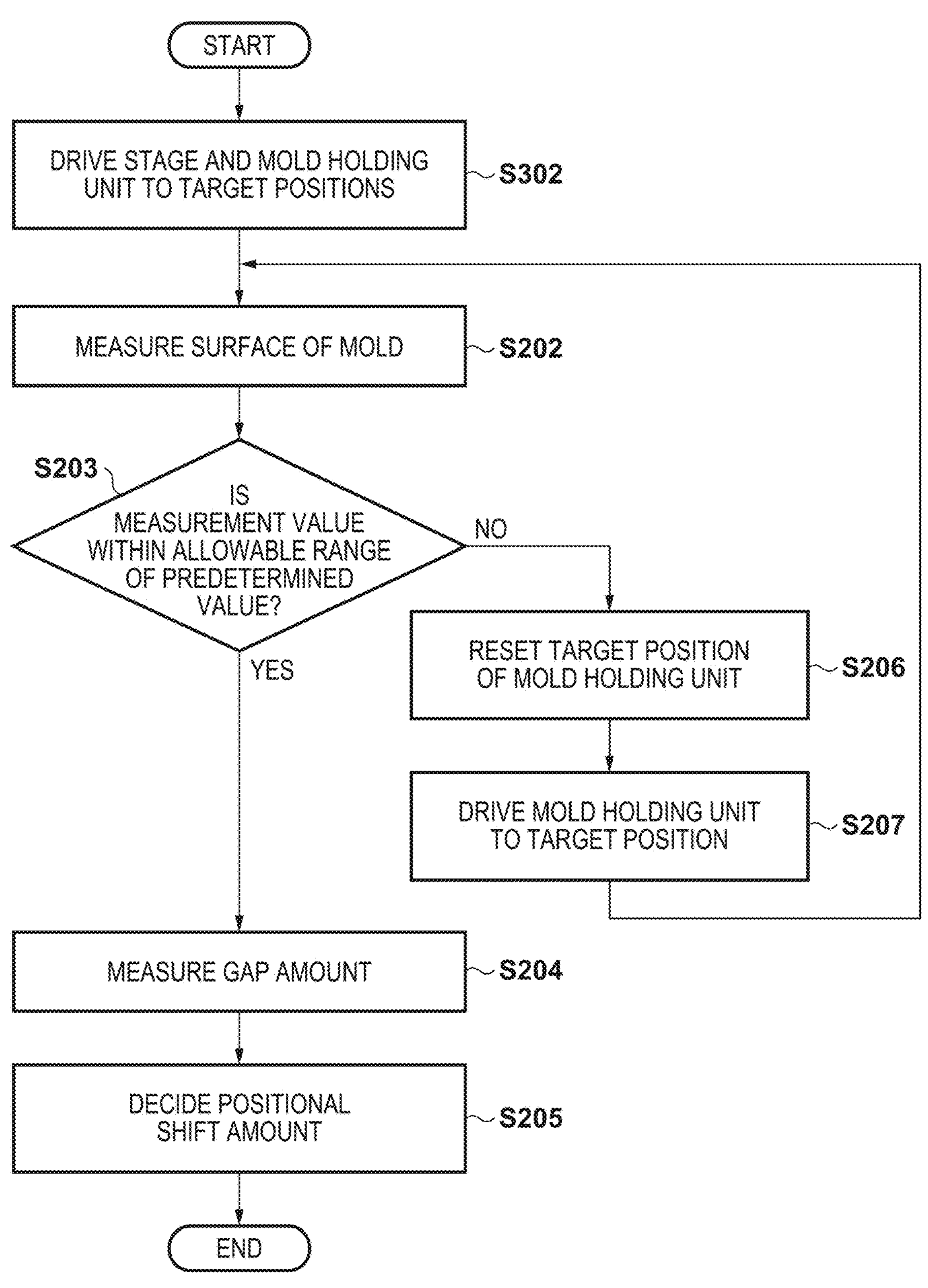
FIG. 4 is a flowchart for describing measurement processing in detail.

FIG. 4 is a flowchart for describing the details of the measurement processing (step S102) for deciding the positional shift amount of the mold M in the plane direction.

In step S201, the stage 110 and the mold holding unit 4 are driven to target positions, respectively. For example, the position where the mold measurement unit 9 is arranged below the measurement start position of the measurement target line (the end portion of the measurement target line) serving as the measurement target among the measurement target lines 20*a* to 20*d* and measurement target lines 21*a* to 21*d* is set as the target position of the stage 110, and the stage 110 is driven to the target position. Further, the mold holding unit 4 is driven to the target position of the mold holding unit 4, which is set by considering the thickness information of the mold M measured and obtained in advance and the like. Note that the target position of the mold holding unit 4 is preferably set such that the measurement value obtained by the mold measurement unit 9 does not largely deviate from the predetermined value (step S203). This can likely to omit the processing in step S207 to be described later.

Here, consider a case in which the process transitions to step S204 without undergoing processing in steps S202, S203, S206, and S207. In step S204, the mold measurement unit 9 measures the gap amounts for the plurality of portions (measurement target lines) of the dug portions 23*a* to 23*d* of the mesa portion Me of mold M while the mold measurement unit 9 is driven by the stage 110. The operation concerning driving of the mold measurement unit 9 by the stage 110 and measurement of the gap amount by the mold measurement unit 9 is repeated from the measurement start position to the measurement end position of the measurement target line. With this, the measurement values for the plurality of portions of the dug portions 23*a* to 23*d* of the mesa portion Me of the mold M and the drive positions of the stage 110 (mold measurement unit 9) at the time of obtaining the plurality of measurement values can be obtained. Note that the operation described above can be performed by, for example, a step-and-repeat method in which step driving of the stage 110 and measurement of the gap amount are repeated for each measurement portion. Alternatively, the operation described above may be performed by a step-and-scan method in which the gap amount is simultaneously measured while scan-driving the stage 110.

In the measurement of the gap amount in step S204, the stage 110 is driven in each of the X direction and the Y direction with the center of each of the dug portions 23*a* to 23*d* of the mesa portion Me of the mold M as a reference. For example, in order to allow a positional shift occurring when the mold M is held by the mold holding unit 4, the dimension (measurement range) of the measurement target line 20*a* is set to a range obtained by adding a certain measurement distance to the plane dimension of the dug portion 23*a* in the X direction. When the X-direction length of the dug portion 23*a* is 1 mm, and the allowable value of the positional shift amount occurring when the mold M is held by the mold holding unit 4 is ±500 μm, the X-direction length of the measurement target line 20*a* is expressed by 1 mm±500 μm×2 (for both sides). If the approximate position of the dug portion 23*a* is known, the measurement range may be limited to the vicinity of the end portions of the dug portion 23*a*. Alternatively, by using the positional shift amount in the X direction measured for a given measurement target line, the approximate position of another measurement target line may be known.

Figure 5A:
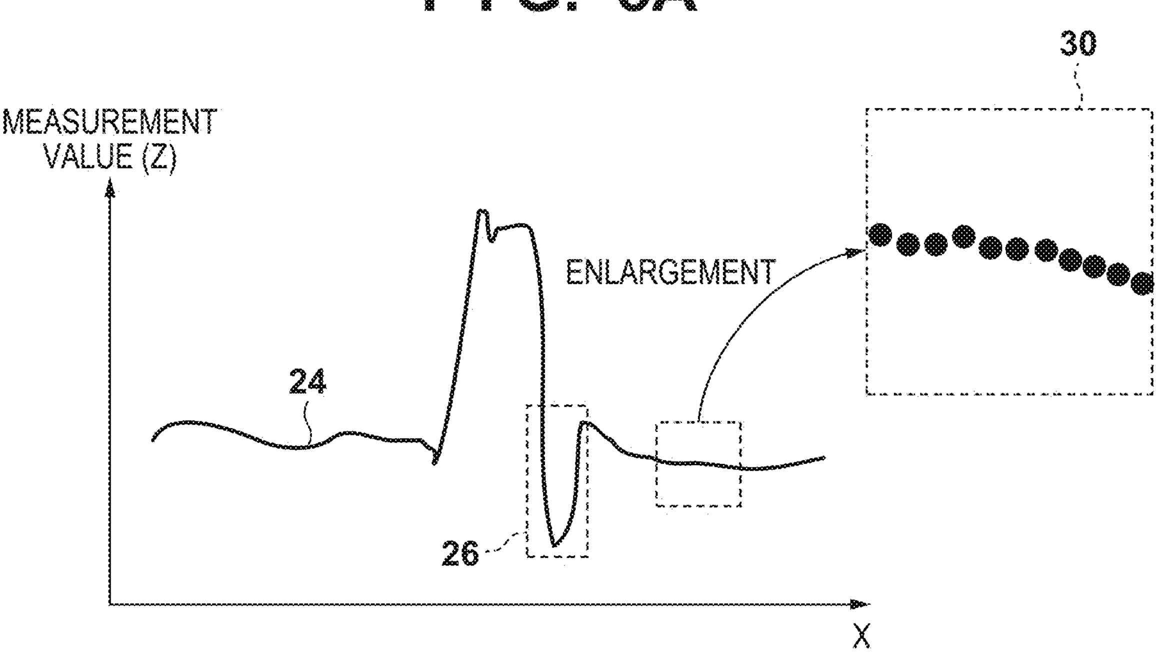
FIGS. 5A and 5B are views each illustrating an example of waveform data.

Examples of the measurement value obtained by the mold measurement unit 9 include waveform data 24 and waveform data 25 as illustrated in FIG. 3. The waveform data 24 and 25 are data indicating the relationship between the measurement portion of the mesa portion Me of the mold M from the mold measurement unit 9 side and the measurement value (gap amount) in the measurement portion for the measurement target lines 20*a* and 21*d*, respectively. FIG. 5A is an enlarged conceptual view of the waveform data 24. In FIG. 5A, a plurality of points 30 correspond to a further enlarged portion of the waveform data 24. Referring to FIG. 5A, it can be seen that the waveform data 24 is data obtained by plotting a plurality of measurement values obtained by the mold measurement unit 9 and a plurality of drive positions of the stage 110 where the plurality of measurement values are obtained.

Referring back to FIG. 4, in step S205, for each of the X-direction measurement target lines 20*a* to 20*d* and Y-direction measurement target lines 21*a* to 21*d* in the dug portions 23*a* to 23*d* of the mesa portion Me of the mold M, the positional shift amount in the X direction and the Y direction is decided (specified). For example, the peak and centroid of the waveform data obtained in step S204 are calculated, and the positional shift amount in the X direction and the Y direction is decided from the difference (Δd2) from the designed position. More specifically, a method of approximating the waveform data to a quadratic parabola by a least square method and calculating the peak position of the quadratic parabola, a method of calculating the centroid from the convex portion of the waveform data, and the like may be used. However, other methods may be used to calculate the peak and centroid of the waveform data.

Note that, in practice, due to various factors, the waveform data is not symmetrical. For example, near the step in the end portion of each of the dug portions 23*a* to 23*d*, due to the influence of the beam stop diameter of the mold measurement unit 9, the step position cannot be clearly observed and appears to be gradual. Further, in the step, diffused reflection of a part of light from the mold measurement unit 9 causes a measurement value deception, and a depression 26 may occur in the waveform data 24 as illustrated in FIG. 5A. This is because the mold measurement unit 9 is formed from a distance sensor (Z direction), and measures the positional shift of the mold M in the X direction and the Y direction by using the distance sensor, so the shape of the waveform data is not guaranteed and becomes asymmetrical.

Furthermore, it is known that, when measuring the gap amount, the mold measurement unit 9 generates a nonlinear error that cyclically changes, which is a so-called cyclic error, in accordance with the optical path amount (distance) from the mold measurement unit 9 to the measurement target. FIG. 6A is a graph illustrating, with the abscissa representing the optical path amount from the mold measurement unit 9 to the measurement target and the ordinate representing the measurement value actually obtained by the mold measurement unit 9, the relationship between the optical path amount and the measurement value. Ideally, the relationship between the optical path amount and the measurement value is the linear relationship as indicated by a dashed line in FIG. 6A. However, in practice, the measurement value includes the nonlinear component (cyclic error) which cyclically changes in accordance with the optical path amount. As illustrated in FIG. 6B, the cyclic error has a waveform that can be approximated by a sine wave in accordance with the optical path amount from the mold measurement unit 9 to the measurement target. The amplitude of the cyclic error (waveform) may range from several tens of nm to 100 nm or more. The cycle of the cyclic error depends of the wavelength of light (measurement light) from the mold measurement unit 9, and is about several hundred nm.

Figure 5B:
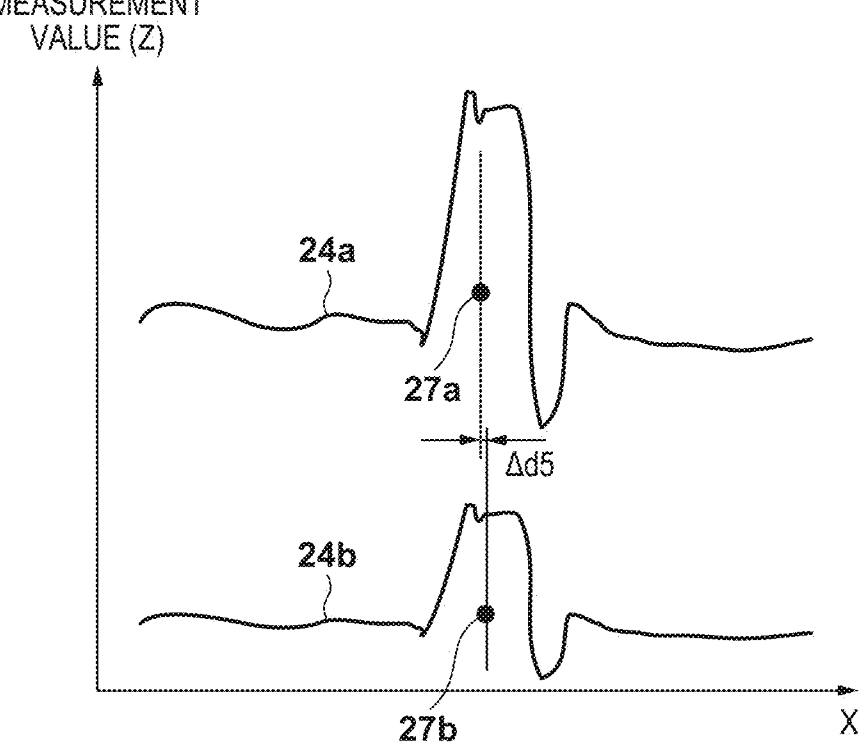

On the other hand, the stage 110 is floated from the reference surface 130A of the base 130 by several μm to several tens of μm by the air guide (stage bottom driving mechanism 112), so that the position control of the stage 110 is pressure control by air. Accordingly, a positional error of about several hundred nm occurs during the stage 110 floating, and an error corresponding to the positional error is included in the measurement value obtained by the mold measurement unit 9. Thus, depending on the height of the floating stage 110, as illustrated in FIG. 5B, waveform data 24*a* or 24*b* different from each other in height (Z-direction position) is obtained as the measurement value obtained by the mold measurement unit 9. Further, as has been described above, since the measurement value obtained by the mold measurement unit 9 includes the cyclic error, the waveform height changes between the waveform data 24*a* and the waveform data 24*b* due to the phase difference. In this case, since the waveform data 24*a* and 24*b* have asymmetric shapes and different waveform heights, an error (Δd5) occurs between a centroid 27*a* of the waveform data 24*a* and a centroid 27*b* of the waveform data 24*b* (between the centroids). If the error Δd5 occurs between the centroid of the waveform data 24*a* and the centroid of the waveform data 24*b*, this leads to an error upon deciding the positional shift amount of the mold M in the plane direction (step S104). As a result, a positional shift occurs when arranging the imprint material 14 on the substrate (step S107) and when forming the pattern on the substrate (step S108). Hence, in a case in which a positional error occurs during the stage 110 floating, it is necessary to prevent occurrence of the height difference between the waveform data (waveform data 24*a* and 24*b*) so as to prevent occurrence of the error Δd5.

Therefore, in this embodiment, a technique is provided that keeps the constant optical path amount (distance) from the mold measurement unit 9 to the mold M (mesa portion Me thereof) as the measurement target when measuring the gap amount by the mold measurement unit 9 while the mold measurement unit 9 is driven by the stage 110 (step S204). To implement the technique, processing in steps S202, S203, S206, and S207 is performed.

In step S202, the mold measurement unit 9 measures the surface of the mold M, that is, the mesa portion Me of the mold M to obtain a measurement value. More specifically, in a state in which the mold measurement unit 9 is arranged below the measurement start position of the measurement target line of the mesa portion Me of the mold M, the mold measurement unit 9 measures the gap amount. Here, the mold measurement unit 9 measures the gap amount for at least one measurement target line (portion) of the plurality measurement target lines of the mesa portion Me of the mold M. At least one measurement target line to be measured by the mold measurement unit 9 is preferably the first measurement target line (portion) for which the mold measurement unit 9 measures the gap amount in the measurement processing (step S102). With this, the time required for measuring the gap amount by the mold measurement unit 9 can be suppressed to be minimum.

In step S203, it is determined whether the measurement value obtained in step S202 falls within the allowable range of the predetermined value. If the measurement value obtained in step S202 falls within the allowable range of the predetermined value, the process transitions to step S204. On the other hand, if the measurement value obtained in step S202 does not fall within the allowable range of the predetermined value, the process transitions to step S206. Note that, in this embodiment, when the cycle of the cyclic error is 400 nm, the allowable value is set to about 10 nm to 20 nm, and the allowable range is set to the range obtained by adding the allowable value×2 to the cycle. The allowable value needs to be smaller than half the cycle of the cyclic error. Considering the drive reproducibility of the mold holding unit 4 and the measurement reproducibility of the mold measurement unit 9, the allowable value is preferably as small as possible. When performing adjustment so as to prevent occurrence of the positional shift during arranging the imprint material 14 on the substrate (step S107) or forming the pattern on the substrate (step S108), the gap amount of the mold measurement unit 9 used in step S102 is set as the predetermined value. The gap amount of the mold measurement unit 9 used in step S102 is the distance between the mold measurement unit 9 and the mesa portion Me of the mold M after the stage 110 is driven such that the mold measurement unit 9 can measure the dug portions 23*a* to 23*d* of the mesa portion Me of the mold M.

In step S206, the target position of the mold holding unit 4 is reset (updated). More specifically, first, the difference between the measurement value obtained in step S202 and the predetermined value is calculated. Then, the position obtained by adding the difference between the measurement value obtained in step S202 and the predetermined value to the target position of the mold holding unit 4 is set as the new target position of the mold holding unit 4.

In step S207, the mold holding unit 4 is driven to the target position, that is, the target position reset in step S206. In other words, the position of the mold holding unit 4 in the direction intersecting the reference surface 130A of the base 130, that is, in the Z direction is adjusted such that the mold holding unit 4 is located at the target position reset in step S206.

Next, with reference to FIGS. 7A to 7F, a description will be given for the procedure of adjustment for preventing occurrence of the positional shift when arranging the imprint material 14 on the substrate (step S107) and when forming the pattern on the substrate (step S108). This procedure is almost the same as the processing procedure illustrated in FIG. 2, but it is necessary to set (decide) a predetermined value (Δg) to be used in step S203 at the time of adjustment, and continuously use the predetermined value (Δg) in the succeeding processing procedure.

Figures 7A, 7B, 7C, 7D, 7E, 7F:
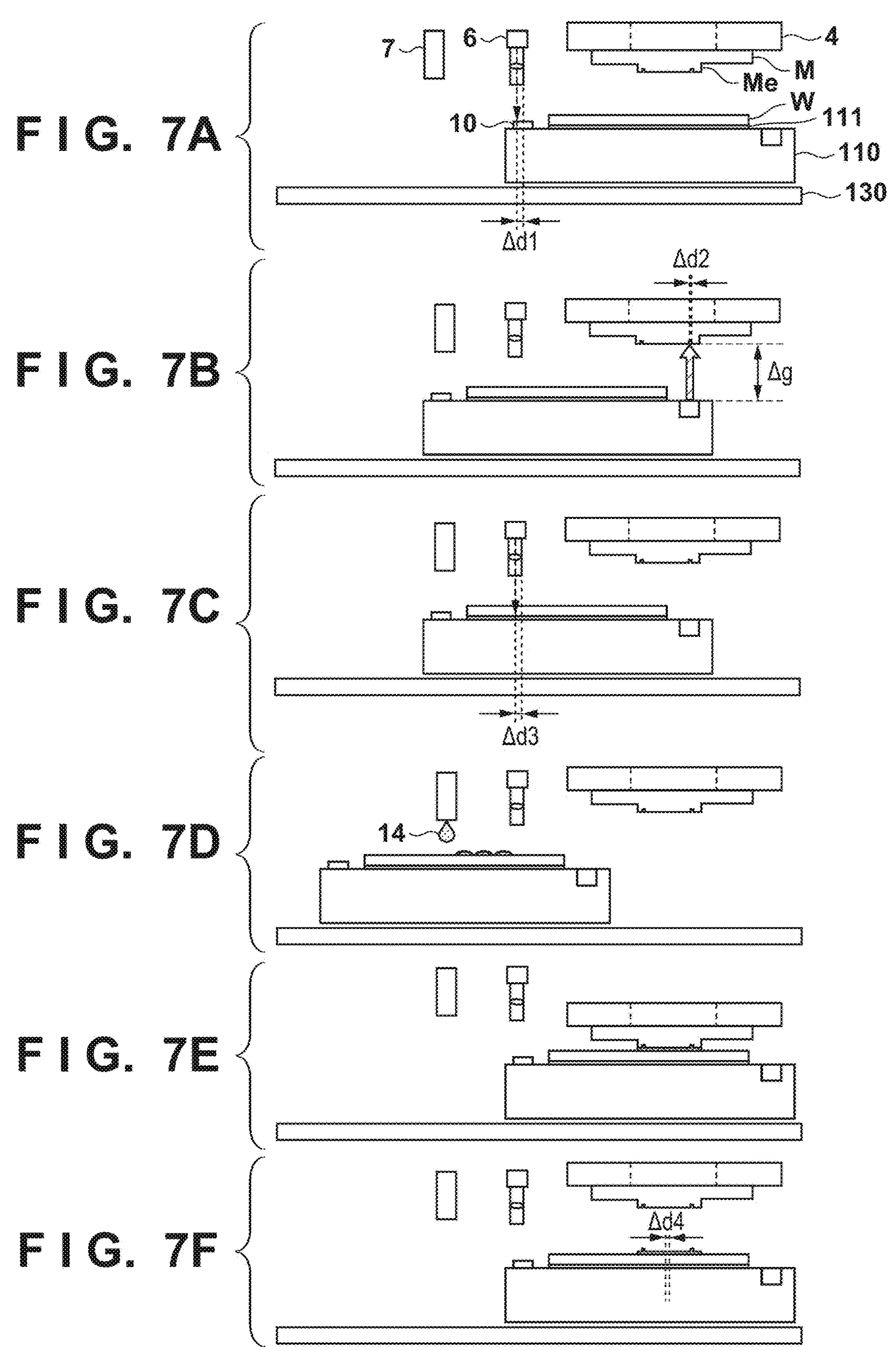
FIGS. 7A to 7F are views for describing the procedure of adjustment for preventing occurrence of a positional shift.

In FIG. 7A, the alignment measurement system 6 measures the mark of the stage reference plate 10 attached to the stage 110. Note that the alignment measurement system 6 measures the mark of the stage reference plate 10 after origin adjustment of the stage 110 is performed by a photo switch or the like. Here, let Δd1 be the positional shift of the mark to be measured by the alignment measurement system 6. By always adding the positional shift Δd1 of the mark to the origin after the origin adjustment of the stage 110, it is possible to perform origin adjustment of the stage 110 with the alignment measurement system 6 as a reference.

In FIG. 7B, as has been described in step S104 of FIG. 2, the positional shift amount of the mold M in the plane direction is decided. Here, in the state in which the origin adjustment of the stage 110 has been performed, the mold measurement unit 9 measures the positional shift of the mold M held by the mold holding unit 4. Let Δd2 be the positional shift of the mold M measured by the mold measurement unit 9. Further, let Δg be the gap amount (the distance between the mold measurement unit 9 and the mold M (mesa portion Me thereof)) when the mold measurement unit 9 measures the positional shift Δd2 of the mold M. The gap amount Δg needs to be determined as the predetermined value when performing step S203 of FIG. 4.

For example, considering the cycle of the cyclic error, the gap amount Δg is set to fall within the distance range corresponding to the range where the measurement value obtained by the mold measurement unit 9 is insensitive to the cyclic error. More specifically, the gap amount Δg (predetermined value) is set (determined) such that the optical path amount from the mold measurement unit 9 to the mold M (mesa portion Me thereof) as the measurement target matches the portion of one of antinodes 32*a* to antinode 32*g* of a sine wave approximating the cyclic error, as illustrated in FIG. 6B. With this, even if the distance (gap amount) from the mold measurement unit 9 to the mold M deviates (fluctuates) from the predetermined value, a height difference of the waveform data is unlikely to occur. Therefore, the gap amount Δg, that is, the predetermined value is preferably set so as to match the antinode portion of the sine wave when the cyclic error is approximated by the sine wave.

In FIG. 7C, as has been described in step S106 of FIG. 2, the alignment measurement system 6 measures the plurality of alignment marks provided in the substrate W, thereby deciding the positional shift of the substrate W in the plane direction. Here, in the state in which the origin adjustment of the stage 110 has been performed, the alignment measurement system 6 measures the positional shift of the substrate W held by the stage 110 (chuck 111). Let Δd3 be the positional shift of the substrate W measured by the alignment measurement system 6.

In FIG. 7D, as has been described in step S107 of FIG. 2, the supply unit 7 arranges the imprint material 14 on the substrate (on the shot region of the substrate W). Here, in the state in which the origin adjustment of the stage 110 has been performed, it is necessary to arrange the imprint material 14 on the substrate while considering the positional shift Δd3 of the substrate W so no positional shift occurs in the imprint material 14 arranged on the substrate W by the supply unit 7. It is also necessary to arrange the imprint material 14 on the substrate while considering the positional shift Δd2 of the mold M so no shift occurs when bringing the mold M into contact with the imprint material 14 on the substrate. Accordingly, in the state in which the origin adjustment of the stage 110 has been performed, the imprint material 14 is arranged on the substrate 14 while considering the positional shift Δd3 of the substrate W and the positional shift Δd2 of the mold M.

In FIG. 7E, the mold M is brought into contact with the imprint material 14 on the substrate, the mold M and the substrate W are aligned, and the irradiation unit 2 emits the light 17 to cure the imprint material 14. At this time as well, as has been described above, the positional shift Δd3 of the substrate W and the positional shift Δd2 of the mold M are considered.

In FIG. 7F, after the mold M is released from the cured imprint material 14 on the substrate, the alignment measurement system 6, an external measuring device (not shown), or the like measures the positional shift of the pattern of the imprint material 14 formed on the substrate. At this time, the outer shape or underlying pattern of the substrate W is compared with the pattern of the imprint material 14 formed on the substrate, and the comparison result is obtained as a positional shift Δd4. By considering, in steps S107 and S108 of FIG. 2, the positional shift Δd4 of the pattern of the imprint material 14 formed on the substrate, it is possible to decrease the shift of the pattern of the imprint material 14 formed on the substrate. Further, by adjusting the gap amount Δg to the predetermined value (within the allowable range thereof) when deciding the positional shift amount of the mold M in the plane direction in steps S102 and S104 of FIG. 2, the position of the mold M in the plane direction can be obtained with high accuracy, and this is advantageous in forming the pattern on the substrate.

As has been described above, in this embodiment, before performing the measurement processing (step S102), the Z-direction position of the mold holding unit 4 is adjusted such that the gap amount measured by the mold measurement unit 9 falls within the range where the measurement value is insensitive to the cyclic error. Hence, in the measurement processing, when the mold measurement unit 9 measures the plurality of portions of each of the dug portions 23*a* to 23*d* provided in the mesa portion Me of the mold M while the mold measurement unit 9 is driven by the stage 110, it is possible to decrease the fluctuation of the measurement value caused by the cyclic error. With this, the plane-direction position of the mold M held by the mold holding unit 4 can be obtained with high accuracy, and this is advantageous in forming the pattern of the imprint material 14 on the substrate while suppressing the positional shift.

Figure 8:
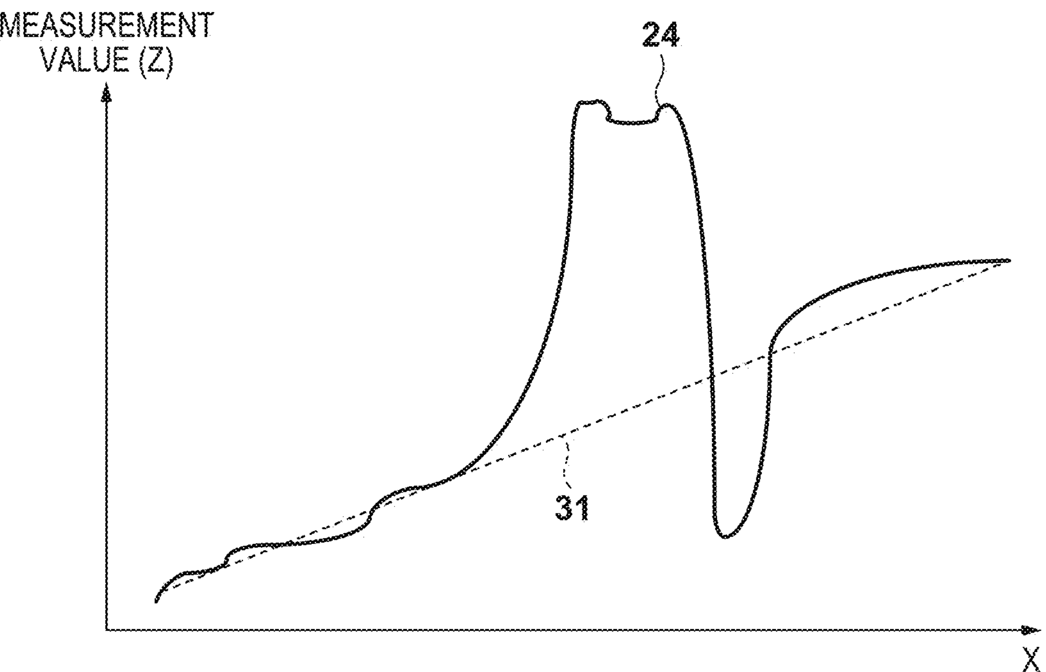
FIG. 8 is a graph illustrating an example of the waveform data.

In this embodiment, a description has been given while taking, as an example, the case where both the mold holding unit 4 and the stage 110 are driven to the target positions in step S201 as illustrated in FIG. 4. However, the waveform data 24 as the measurement value obtained by the mold measurement unit 9 may have a slanted waveform as illustrated in FIG. 8. This is because, even if the stage 110 is floated by the stage bottom driving mechanism 112 (air guide), it requires time for the floating state to reach equilibrium. Accordingly, in step S204, during driving the stage 110, a Z-direction position 31 (height) of the stage 110, that is, the position (Z direction) of the mold measurement unit 9 provided on the stage 110 may fluctuate.

Figure 9:
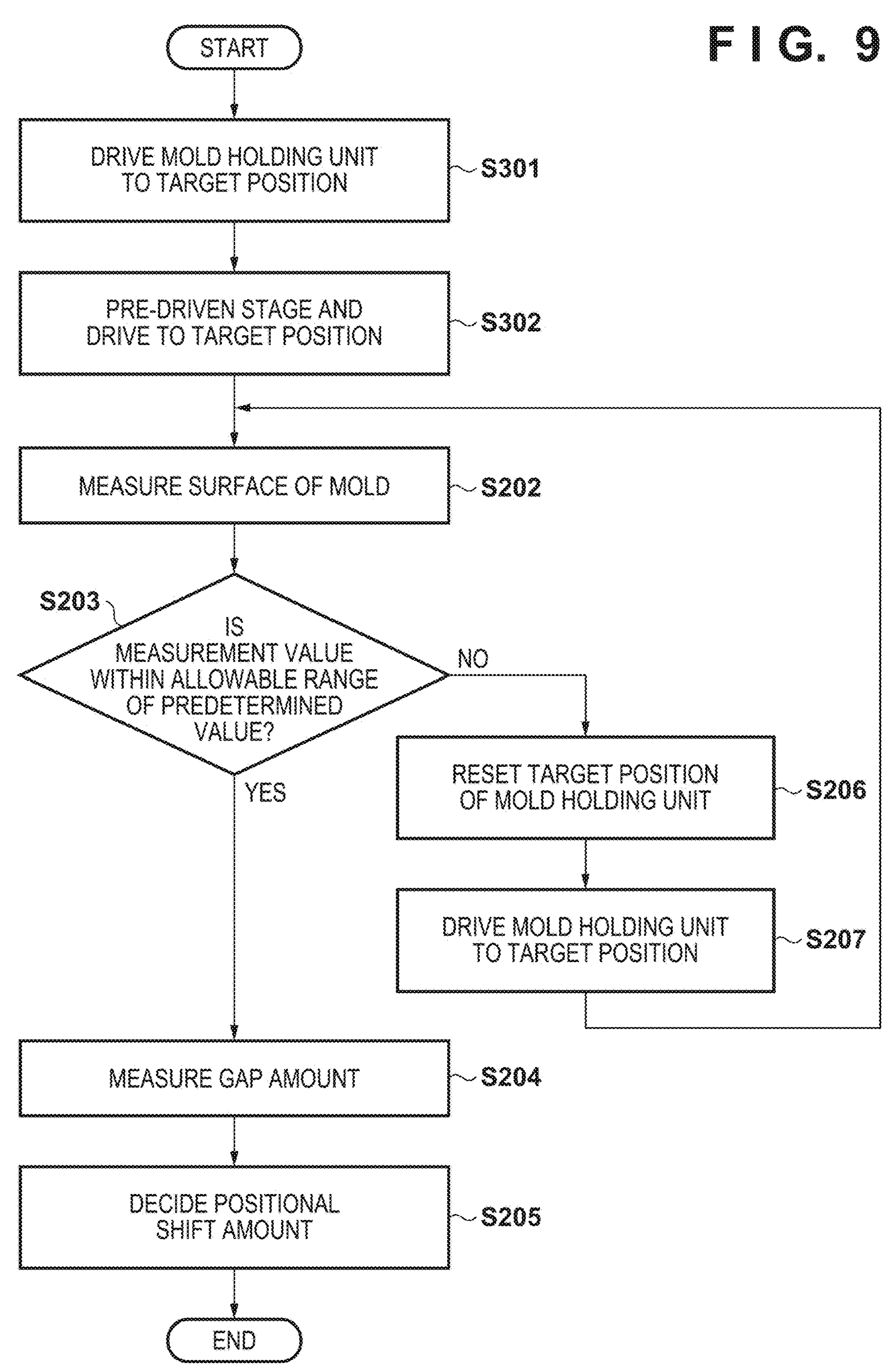
FIG. 9 is a flowchart for describing the measurement processing in detail.

In this manner, in a case in which the Z-direction position of the stage 110 fluctuates, instead of step S201, steps S301 and S302 are preferably performed as illustrated in FIG. 9. In step S301, the mold holding unit 4 is driven to the target position. In step S302, the stage 110 is pre-driven, and then driven to the target position. In this embodiment, pre-driving of the stage 110 means driving the stage 110 (mold measurement unit 9 provided thereon) in a direction (plane direction) along the reference surface 130A of the base 130 before the position of the mold holding unit 4 in the Z direction is adjusted (step S207). Note that, in the pre-driving of the stage 110, the stage 110 (mold measurement unit 9 driven thereby) is driven with a stroke larger than the stroke for driving the stage 110 (mold measurement unit 9 driven thereby) in the measurement processing. With this, in step S204, the floating state of the stage 110 reaches equilibrium, and the waveform data as the measurement value obtained by the mold measurement unit 9 does not have a slanted waveform. Note that processing in step S301 and processing in step S302 may be performed in parallel.

The pattern of a cured product formed using the imprint apparatus 1 in the embodiment is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Next, description regarding a detailed method of manufacturing an article is given. As illustrated in FIG. 10A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

As shown in FIG. 10B, a side of the mold for imprint with a projection and groove pattern is formed on and caused to face the imprint material on the substrate. As illustrated in FIG. 10C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

As shown in FIG. 10D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

As shown in FIG. 10E, when etching is performed using the pattern of the cured product as an etching resistant mask, a portion of the surface of the processed material where the cured product does not exist or remains thin is removed to form a groove. As shown in FIG. 10F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2023-125654 filed on Aug. 1, 2023, which is hereby incorporated by reference herein in its entirety.

What is claimed is:

1. An imprint apparatus that forms a pattern in an imprint material on a substrate by using a mold, the apparatus comprising:

a mold holding unit configured to hold and drive the mold;

a substrate holding unit configured to hold and drive the substrate;

a measurement unit configured to measure a distance to a surface of the mold held by the mold holding unit, thereby obtaining a measurement value;

a driving unit configured to drive the measurement unit in a direction along a reference surface serving as a reference for driving the substrate holding unit; and a control unit configured to perform measurement processing of measuring the distance by the measurement unit for a plurality of portions of a structure provided on the surface of the mold while driving the measurement unit by the driving unit, thereby obtaining a position of the mold in the direction from measurement values of the plurality of portions, wherein the measurement value includes a cyclic error caused by a distance between the measurement unit and the mold, and before performing the measurement processing, the control unit adjusts a position of the mold holding unit in a direction intersecting the reference surface such that the distance measured by the measurement unit falls within a distance range corresponding to a range where the measurement value is insensitive to the cyclic error, and before adjusting the position of the mold holding unit in the direction intersecting the reference surface, the control unit performs pre-driving of driving the measurement unit in the direction along the reference surface by the driving unit.

2. The apparatus according to claim 1, wherein the mold includes a convex portion having a convex shape protruding from a periphery portion in the surface, and the structure is provided in the convex portion, and in the measurement processing, the control unit obtains, as the position of the mold, a position of the convex portion in the direction.

3. The apparatus according to claim 1, wherein the distance range is a distance range corresponding to a range smaller than half a cycle of the cyclic error.

4. The apparatus according to claim 1, wherein the range where the measurement value is insensitive to the cyclic error is an antinode part of a sine wave when the cyclic error is approximated by the sine wave.

5. The apparatus according to claim 1, wherein the structure includes a recessed concave portion formed by digging the surface.

6. The apparatus according to claim 5, wherein the concave portion has a depth of not less than 20 nm and not more than 200 nm.

7. The apparatus according to claim 1, wherein before performing the measurement processing, the control unit measures the distance by the measurement unit for at least one portion of the plurality of portions, and based on a measurement value of the at least one portion, adjusts the position of the mold holding unit in the direction intersecting the reference surface such that the distance measured by the measurement unit falls within the distance range.

8. The apparatus according to claim 7, wherein the at least one portion is a first portion for which the measurement unit measures the distance in the measurement processing.

9. The apparatus according to claim 1, wherein in the pre-driving, the control unit drives the measurement unit by the driving unit with a stroke larger than a stroke for driving the measurement unit by the driving unit in the measurement processing.

10. The apparatus according to claim 1, wherein the measurement unit is provided in the substrate holding unit, and the driving unit drives the measurement unit by driving the substrate holding unit.

11. The apparatus according to claim 1, wherein the control unit performs the measurement processing in a state in which the distance between the measurement unit and the mold falls within the distance range.

12. The apparatus according to claim 1, wherein based on the position of the mold obtained in the measurement processing, the control unit performs a process of aligning the mold and the substrate and transferring a pattern of the mold to the substrate.

13. An article manufacturing method comprising:

forming a pattern on an imprint material on a substrate using an imprint apparatus defined in claim 1;

processing the substrate after the forming; and manufacturing an article from the substrate processed in the processing.

* * * * *